(12) United States Patent
Forbes et al.

(10) Patent No.: US 6,377,148 B1
(45) Date of Patent: Apr. 23, 2002

(54) ASYMMETRIC ZONAL SHIM COILS FOR MAGNETIC RESONANCE

(75) Inventors: Lawrence Kennedy Forbes, Hobart; Stuart Crozier, Wilston; David Michael Doddrell, Westlake, all of (AU)

(73) Assignee: NMR Holdings No. 2 Pty Limited, Woolloomooloo (AU)

( * ) Notice: Subject to any disclaimer, the term of this patent is extended or adjusted under 35 U.S.C. 154(b) by 0 days.

(21) Appl. No.: 09/941,181

(22) Filed: Aug. 27, 2001

(30) Foreign Application Priority Data

Aug. 30, 2000 (AU) .............................................. PQ9787

(51) Int. Cl.[7] ................................................ G01V 3/00
(52) U.S. Cl. ........................ 335/301; 335/299; 324/320
(58) Field of Search ................................ 335/216, 296, 335/299, 301; 324/318, 319, 320

(56) References Cited

U.S. PATENT DOCUMENTS

| | | | |
|---|---|---|---|
| 3,569,823 A | | 3/1971 | Golay |
| 3,622,869 A | | 11/1971 | Golay |
| 4,506,247 A | * | 3/1985 | Vermilyea .................... 335/216 |
| 4,896,129 A | | 1/1990 | Turner et al. |
| 5,760,582 A | | 6/1998 | Morrone |
| 5,818,319 A | | 10/1998 | Crozier et al. |
| 6,140,900 A | | 10/2000 | Crozier et al. |

FOREIGN PATENT DOCUMENTS

EP     320 285     6/1989

OTHER PUBLICATIONS

U.S. application No. 09/947,178, Crozier, et al., filed Sep. 5, 2001.

Chronik et al., "Design and Fabrication of a Three–Axis Edge ROU Head and Neck Gradient Coil," *Magnetic Resonance in Medicine*, 44:955–963, 2000.

Crozier et al., "Gradient–Coil Design by Simulated Annealing," *Journal of Magnetic Resonance*, Series A, 103: 354–357, 1993.

Crozier et al., "A novel design methodology for Nth order shielding longitudinal coils for NMR," *Meas. Sci. Technol.* 7:36–41, 1996.

Hoult et al., "Accurate Shim–Coil Design and Magnet–Field Profiling by a Power–Minimization–Matrix Method," *Journal of Magnetic Resonance*, Series A 108:9–20, 1994.

Turner, Robert, "Minimum inductance coils," *J. Phys. E. Sci., Instrum.*, 21:948–952, 1988.

Turner, R., "A target field approach to optimal coil design," *J. Phys. D: Appl. Phys.* 19:L147–151, 1986.

Zhao, et al., "Asymmetric MRI Magnet Design Using a Hybrid Numerical Method," *Journal of Magnetic Resonance*, 131:340–346, 1999.

\* cited by examiner

*Primary Examiner*—Ramon M. Barrera
(74) *Attorney, Agent, or Firm*—Maurice M. Klee

(57) ABSTRACT

Asymmetric zonal shim coils and shim sets for magnetic resonance applications are provided. Also provided are Fourier-series based methods for designing such coils as well as symmetric coils.

29 Claims, 13 Drawing Sheets

ASYMMETRIC ZONAL SHIM COILS FOR MAGNETIC RESONANCE

FIELD OF THE INVENTION

This invention relates to shim coils for magnetic resonance applications. In particular, the invention is directed to the design of asymmetric shim coils for magnetic resonance imaging machines.

BACKGROUND OF THE INVENTION

In magnetic resonance imaging (MRI) applications, a patient is placed in a strong and homogeneous static magnetic field, causing the otherwise randomly oriented magnetic moments of the protons, in water molecules within the body, to precess around the direction of the applied field. The part of the body in the homogeneous region of the magnet is then irradiated with radio-frequency (RF) energy, causing some of the protons to change their spin orientation. The net magnetization of the spin ensemble is nutated away from the direction of the applied static magnetic field by the applied RF energy. The component of this net magnetization orthogonal to the direction of the applied static magnetic field acts to induce measurable signal in a receiver coil tuned to the frequency of precession. This is the magnetic resonance (MR) signal. Most importantly, the frequency at which protons precess around the applied static field depends on the background magnetic field. Since this is designed to vary at each point in the sample in an imaging experiment, it follows that the frequency of the MR signal likewise depends on location. The signal is therefore spatially encoded, and this fact is used to construct the final image.

In practice, construction tolerances mean that MR magnets do not generate perfectly homogeneous fields over the DSV (the specified Diameter-Sensitive Volume; also referred to herein as the "predetermined shimming volume") and therefore require some adjustment of the field purity which is achieved by shimming. In addition, the presence of the patient's body perturbs the strong magnetic field slightly, and so shim coils are used to correct the field, to give the best possible final image. The field within the DSV is typically represented in terms of spherical harmonics, and so impurities in the field are analyzed in terms of the coefficients of an expansion in these harmonics. Correction coils are therefore designed to produce a particular magnetic field shape that can be added to the background magnetic field, so as to cancel the effect of one or more of these spherical harmonics. Many of these coils may be present in a particular MRI device, and each may have its own power supply to produce the required current flow. Zonal shim coils are those that possess complete azimuthal symmetry; that is, have the same current density around the periphery of the cylinder for each point along its length.

The main design task associated with these correction coils is to determine the precise windings on the coil that will produce the desired magnetic field within the coil. One method, due to Turner (1986, A target field approach to optimal coil design, J. Phys. D: Appl. Phys. 19, 147–151; U.S. Pat. No. 4,896,129), is to specify a desired target field inside the cylinder, at some radius less than the coil radius. Fourier transform methods are then used to find the current density on the surface of the coil required to give the desired target field. This method has been widely used, and is successful in applications, but suffers from three significant drawbacks. Firstly, the method does not allow the length of the coil to be specified in advance. Secondly, so that the Fourier-transform technique can be applied to finite length coils, the target fields must be moderated or smoothed in some way, so that the Fourier transforms converge, and this can introduce unnecessary errors and complications. Thirdly, because the coils in this approach are not given an explicit length, there is no straightforward way of using this method to design asymmetrically locates target fields in a coil of finite length.

An alternative method for the design of coils of finite length is the stochastic optimization approach pioneered by Crozier and Doddrell (1993, Gradient-coil design by simulated annealing, J. Magn. Reson. A 103, 354–357). This approach seeks to produce a desired field in the DSV using optimization methods to adjust the location of certain loops of wire and the current flowing in those loops. The method is very robust, since it uses simulated annealing as its optimization strategy, and it can incorporate other constraints in a straightforward manner by means of a Lagrange-multiplier technique. Coils of genuinely finite length are accounted for without approximation by this technique, and it therefore has distinct advantages over the target field method (and alternative methods based on finite-elements). Since it relies on a stochastic optimization strategy, it can even cope with discontinuous objective functions, and so can accommodate adding or removing loops of wire during the optimization process. The method has the drawback that the stochastic optimization technique can take many iterations to converge, and so can be expensive of computer time.

It is an object of this invention to provide coil structures that generate desired fields within certain specific, and asymmetric portions of the overall coil.

It is a further object of the present invention to provide a general systematic method for producing a desired zonal magnetic field within the coil, but using a technique that retains the simplicity of a direct analytical approach. In connection with this object, the desired zonal magnetic field can be located symmetrically or asymmetrically with respect to the overall geometry of the coil.

SUMMARY OF THE INVENTION

In one broad form, the invention provides a method for the design of symmetric and asymmetric zonal shim coils of a MR device. The method uses Fourier-series to represent the magnetic field inside and outside a specified volume. Typically, the volume is a cylindrical volume of length 2 L and radius a within the MR device. The current density on the cylinder is also represented using Fourier series. This approximate technique ignores "end effects" near the two ends of the coil, but gives an accurate representation of the fields and currents inside the coil, away from the ends.

Any desired field can be specified in advance on the cylinder's radius, over some portion (e.g., a non-symmetric portion) $pL<z<qL$ of the coil's length ($-1<p<q<1$). Periodic extension of the field is used in a way that guarantees the continuity of the field, and therefore gives good convergence of the Fourier series.

For example, the desired target field in an asymmetric position of the cylindrical volume is represented as a periodic function of period equal to twice the length of the coil (i.e. 4 L). The extended periodic target field can be represented as an even periodic extension about an end of the coil. All that is required is to calculate the Fourier coefficients associated with the specified desired field, and from these, the current density on the coil and the magnetic field components then follow. In another broad form, the invention provides asymmetric zonal shim coils for MR systems. Asymmetric shim coils can be used in conventional MR systems or in the newly developed asymmetric magnets, such as the magnets of U.S. Pat. No. 6,140,900.

Thus, in accordance with certain of its aspects, the invention provides a zonal shim coil (e.g., a member of a shim set) having (i) a longitudinal axis (e.g., the z-axis) and (ii) a predetermined shimming volume (the dsv), and comprising a plurality of current-carrying windings which surround and are spaced along the longitudinal axis, said coil producing a magnetic field, the longitudinal component of which is given by:

$$B_z(r, \theta) = \sum_{n=0}^{\infty} r^n (a_{n0} P_{n0}(\cos\theta))$$

where $a_{n0}$ are the amplitudes of the zonal harmonics, $P_{n0}(\cos\theta)$ are Legendre polynomials, n is the order of the polynomial, and r and $\theta$ are radial and azimuthal coordinates, respectively; wherein:

(i) the coil generates at least one predetermined zonal harmonic whose order (n') is greater than or equal to 2, e.g., the coil can generate a single harmonic, e.g., n' can equal, for example, 2, 3, 4, 5, 6, 7, or 8, or, if desired, the coil can simultaneously generate more than one harmonic, e.g., n' can equal 2 and 4 or can equal 3 and 5;

(ii) the coil has first and second ends which define a length 2 L; and (iii) the predetermined shimming volume extends along the longitudinal axis from z=pL to z=qL, where
 (a) $-1 < p < q < 1$;
 (b) $|p| \neq |q|$ (i.e., the predetermined shimming volume is located asymmetrically with respect to the overall geometry of the coil); and
 (c) z=0 is midway between the first and second ends of the coil.

Preferably, all of the coils in the shim set are of the above type.

In the case of zonal shim coils used for high resolution spectroscopy, i.e., NMR, q–p is preferably greater than or equal to 0.01 and most preferably greater than or equal to 0.05. In the case of zonal shim coils used for clinical imaging, i.e., MRI, q–p is preferably greater than or equal to 0.05 and most preferably greater than or equal to 0.5.

In accordance with certain preferred embodiments of the invention, the zonal shim coil generates a single predetermined zonal harmonic, the predetermined shimming volume defines a midpoint M along the longitudinal axis, the predetermined shimming volume has a characteristic radius R given by:

R=(q–p)L/2 when q–p<1, and by:

R=(q–p)L/3 when q–p≧1, and the zonal shim coil has a purity (P') which is less than or equal to 0.2, where:

$$P' = \left( \sum_{0}^{n'-1} |a_{n0}| R^n + \sum_{n'+1}^{n'+6} |a_{n0}| R^n \right) \bigg/ (|a_{n'0}| R^{n'}).$$

Most preferably, P' is less than or equal to 0.05.

In certain specific applications of the invention, the zonal shim coil has the following characteristics:
 (i) n'=2 or 3;
 (ii) q–p≧0.7;
 (iii) 2 L≦1.4 meters; and
 (iv) P'≦0.1;

while in other specific applications, it has the following characteristics:
 (i) n'=4,5,6,7, or 8;
 (ii) q–p≧0.7;
 (iii) 2 L≦1.4 meters; and
 (iv) P'≦0.2.

For clinical imaging applications of the invention, either |p| or |q| is preferably greater than or equal to 0.7.

In accordance with certain others of its aspects, the invention provides a method for designing a zonal shim coil for a magnetic resonance system, said shim coil extending from –L to +L along a longitudinal axis which lies along the z-axis of a three dimensional coordinate system, said method comprising:

(a) selecting a cylindrical surface having a radius r=a for calculating current densities for the shim coil (the "r=a surface"), said surface surrounding the longitudinal axis, extending from –L to +3 L, and having a first region which extends from –L to +L and a second region which extends from +L to +3 L;

(b) for the first region, selecting a set of desired values for the longitudinal component of the magnetic field ($B_z(a^-, z)$) to be produced by the shim coil at locations which are (i) spaced along the longitudinal axis and (ii) on the internal side of the r=a surface (r=$a^-$) wherein:
 (1) the first region consists of first, second, and third subregions which extend in order along the longitudinal axis from z=–L to z=+L, with the first subregion extending from z=–L to z=pL, the second subregion extending from z=pL to z=qL, and the third subregion extending from z=qL to z=+L, where:

$-1 < p < q < 1$;

(2) the desired values for the longitudinal component of the magnetic field are defined by a preselected zonal harmonic for the second subregion; and
 (3) the desired values for the magnetic field for the first and third subregions are selected to satisfy the following equation:

$$\int_{-L}^{L} B_z(a^-, z) dz = 0$$

(c) for the second region, selecting a set of calculation values for locations which are (i) spaced along the longitudinal axis and (ii) on the internal side of the r=a surface (r=$a^-$) wherein said set of calculation values are the reflection about z=+L of the set of desired values of the first region; and (d) determining a current density distribution $j_s(z)$ for the shim coil for the first region by:

(1) calculating coefficients for a Fourier series expansion for the longitudinal magnetic field from the set of selected desired values for the first region and the set of selected calculation values for the second region; and (2) calculating the current density distribution by simultaneously solving the equations (1) to (3) set forth below in combination with the equation $B=-\nabla\psi$ using the Fourier coefficients calculated in step (d)(1).

The method preferably also includes the additional step of generating discrete current carrying windings for the shim coil from the current density distribution $j_s(z)$ by:

(1) integrating $|j_s(z)|$ with respect to z over the range from $-L$ to $+L$ to determine a total current J;

(2) selecting a number of current carrying windings N;

(3) determining a current per winding value $I=J/N$;

(4) determining a set of $j_s(z)$ blocks over the range from $-L$ to $+L$ such that the integral of $|j_s(z)|$ over each block equals I; and (5) for all blocks having a net polarity for $j_s(z)$ over the block, placing a winding at the center of the block, the direction of the current in the winding corresponding to said net polarity.

The method can be used for a symmetrically located second subregion in which case $|p|=|q|$ or for an asymmetrically located second subregion in which case $|p|\neq|q|$.

Further details of the invention are presented below.

BRIEF DESCRIPTION OF THE DRAWINGS

The invention will be described by way of examples with reference to the drawings in which.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DETAILED DESCRIPTION OF EMBODIMENTS OF THE INVENTION

Figure 5:
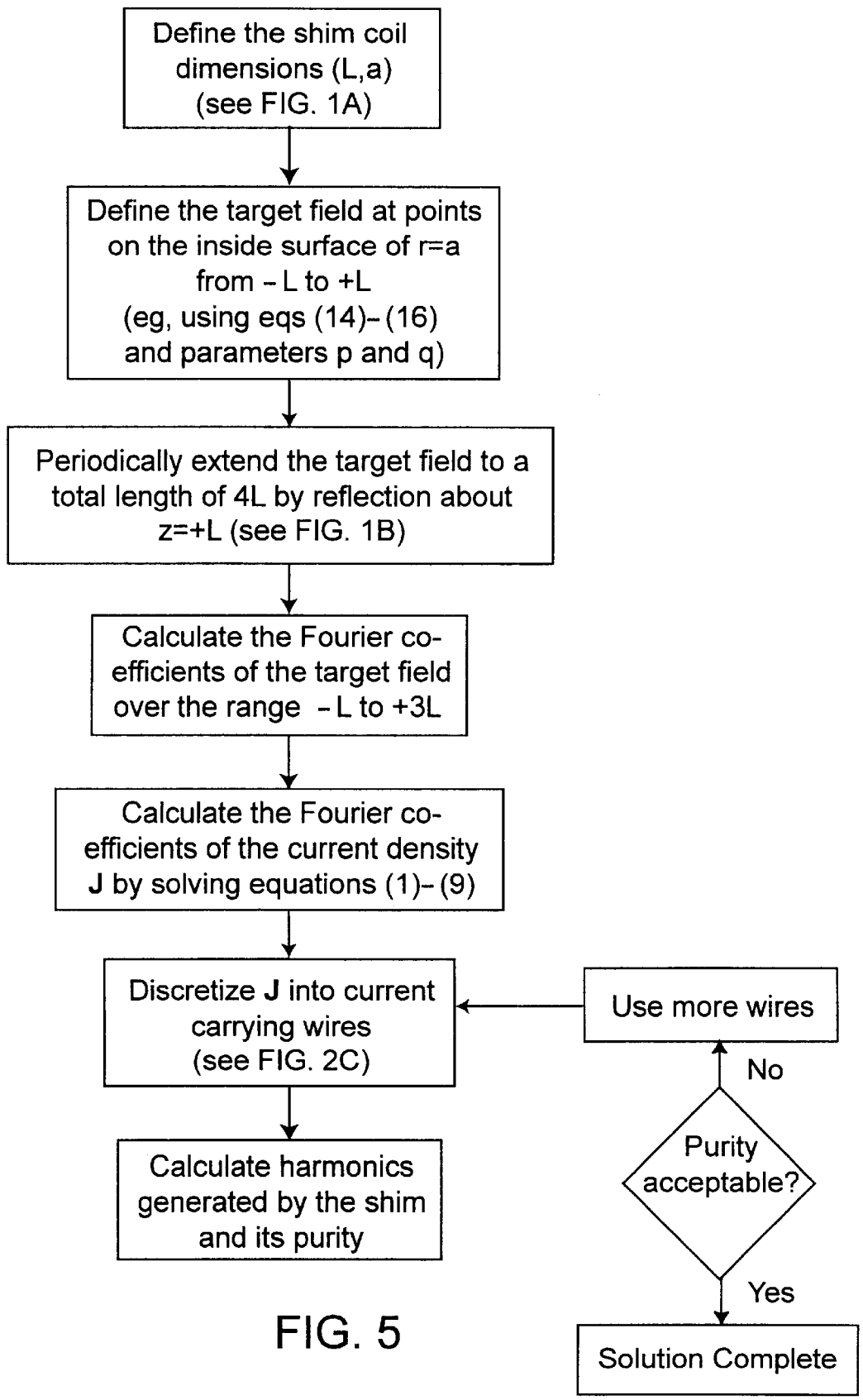
FIG. 5 is a flow chart useful in describing and understanding the method of the invention.

As discussed above, the present invention relates to zonal shim coils having prescribed properties and to methods for designing these and other types of coils. FIG. 5 illustrates the overall numerical procedure of the invention with reference to the various equations presented below.

The method of the invention as described below is preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, C++, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by DIGITAL EQUIPMENT CORPORATION, IBM, HEWLETT-PACKARD, SUN MICROSYSTEMS, SGI or the like. For example, the numerical procedures of the invention can be implemented in C-code and performed on a personal computer. The system should include means for inputting data and means for outputting the results of the shim coil design both in electronic and visual form. The output can also be stored on a disk drive, tape drive, or the like for further analysis and/or subsequent display.

Figure 1A:
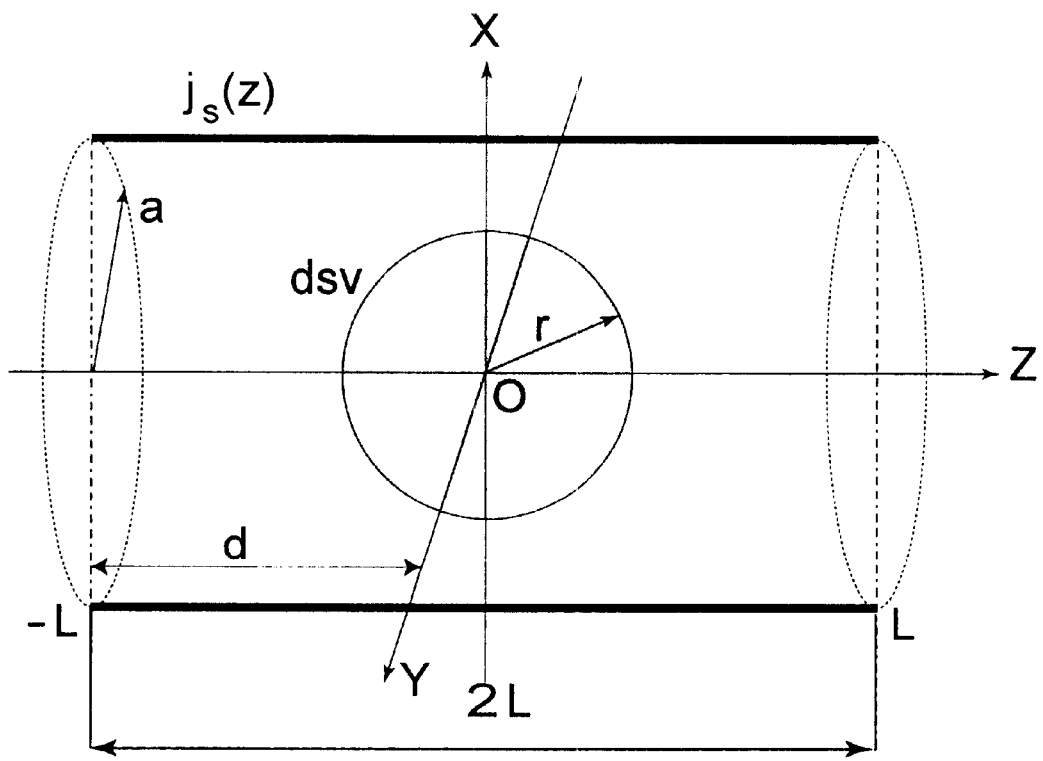
FIG. 1A illustrates the general layout of a cylindrical shim coil system in which changing the value of d changes the asymmetry of the predetermined shimming volume ('target region') relative to the coil structure.

Turning to the figures, FIG. 1A shows a cylindrical coil of length 2 L and radius a. The design of such a coil so that it gives a desired magnetic field within a preselected region within the coil involves the solution of a well-known mathematical set of equations and boundary conditions.

The magnetic field vector H(r,z) (amps/metre) is related to the magnetic induction vector B(r,z) (webers/square meter) by the constitutive relation $B=\mu_0 H$, and this field can be represented as the gradient of a magnetic scalar potential $\psi(x,y,z)$ by means of the relation $B=-\nabla\psi$. Here, the constant $\mu_0$ represents the magnetic permeability of free space. The scalar potential satisfies Laplace's equation $$\nabla^2 \psi = \frac{1}{r}\frac{\partial}{\partial r}\left(r\frac{\partial \psi}{\partial r}\right) + \frac{\partial^2 \psi}{\partial z^2} = 0 \tag{1}$$

both inside and outside the coil of radius a. In cylindrical polar coordinates, the magnetic induction field B has component $B_r(r,z)$ in the radial (r) direction, and component $B_z(r,z)$ in the axial (z) direction that points along the centre of the coil. The two well-known boundary conditions on this magnetic induction field are firstly that the radial component must be continuous at the cylinder, so that $$B_r(a^+,z) = B_r(a^-,z) \text{ on } r=a. \tag{2}$$

For purely zonal fields, there is a surface current density component $j_s(z)$ (amps/meter) that flows around the coil in a purely circumferential (azimuthal) direction. The second boundary condition at the cylinder relates this current density to the discontinuity in the axial component of the magnetic induction field, according to the equation $$B_z(a^+,z) - B_z(a^-,z) = -\mu_0 j_s(z) \text{ on } r=a. \tag{3}$$

If the coil is assumed to have length 2 L, and to lie along the z-axis in the interval $-L < z < L$, then the set of equations (1)–(3) is in general too difficult to solve in closed form, for a coil of finite length, with some specified target field. To address this problem, the present invention provides an approximate solution methodology for this set of equations, that allows zonal target fields of any desired shape to be specified within the coil. This gives rise to a general formula for the current density $j_s(z)$ on the surface of the coil, from which coil winding patterns can then be constructed.

Figure 1B:
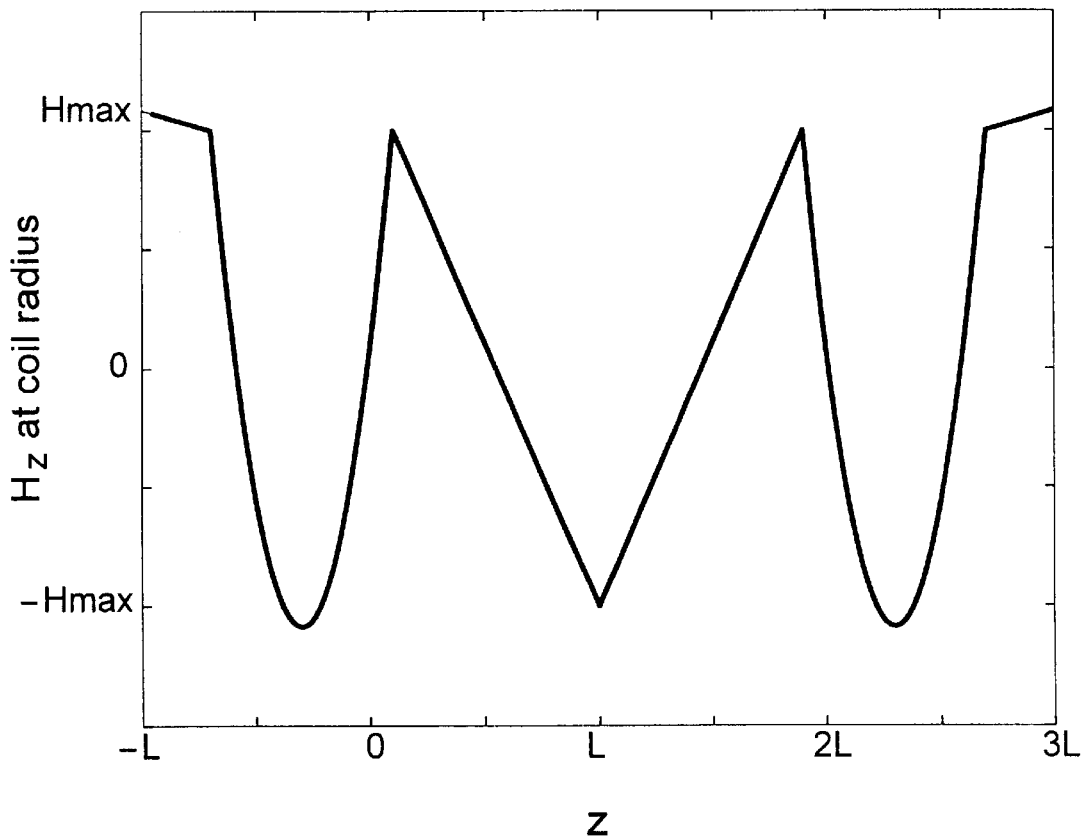
FIG. 1B is a diagram illustrating how the desired target field, in a portion of the coil, is extended to the whole coil $-L<z<L$ and then continued by reflection about $z=L$ to form an extended periodic function of period 4L.

An aspect of this invention is to represent the desired target field as a periodic function of period equal to twice the length of the coil (that is, period 4L) as shown in FIG. 1B. This is an approximation to the exact situation, since it ignores end leakage effects at the two ends of the coil. However, it should give an accurate representation of the true field within the coil, away from the ends.

Once the target field has been represented as an extended periodic function in this way, there is freedom of choice as to the precise details of how the periodic extension is to be done. A second aspect of this invention is to represent the extended periodic target field as an even periodic extension about the right-hand end of the coil, where z=L. The target field is specified at the inside surface of the cylinder itself, where r=a (also referred to as the "internal side of the r=a surface" and denoted as "a⁻"); therefore, the target field is the axial component $B_z(a^-,z)$ of the magnetic induction vector, and the periodically extended field is $$\tilde{B}_z(a^-,z) = \begin{cases} B_z(a^-,z), & -L < z < L \\ B_z(a^-, 2L-z), & L < z < 3L \end{cases}. \tag{4}$$

The target field $B_z(a^-,z)$ in the actual coil $-L < z < L$ may be chosen completely arbitrarily, subject to the condition $$\int_{-L}^{L} B_z(a^-, z) dz = 0, \tag{5}$$

and the choice in equation (4) guarantees that the periodically extended function $\tilde{B}_z$ is everywhere continuous.

With this approximation of the target field by an extended periodic function, the mathematical set of equations and boundary conditions (1)–(3) can now be solved using Fourier series, according to well-known principles. See, for example, E. Kreyszig, *Advanced Engineering Mathematics*, John Wiley and Sons, Inc., New York, 1962, pages 482–486. The extended target field $\tilde{B}_z$ in equation (4) can be represented in the form $$\tilde{B}_z(a^-, z) = \sum_{k=1}^{\infty} C_{2k} \cos(\gamma_k z) + \sum_{k=0}^{\infty} D_{2k+1} \sin(\delta_k z), \tag{6}$$

where $$\gamma_k = \frac{k\pi}{L} \tag{7}$$

and $$\delta_k = \frac{(2k+1)\pi}{2L},$$

and the Fourier coefficients are given in terms of the target field according to the formulae $$C_{2k} = \frac{1}{L}\int_{-L}^{L} B_z(a^-, z) \cos(\gamma_k z) dz \tag{8}$$

$$D_{2k+1} = \frac{1}{L}\int_{-L}^{L} B_z(a^-, z) \sin(\delta_k z) dz.$$

Standard solution methods applied to equations (1)–(3) now give the current density on the surface of the cylindrical coil to be $$j_s(z) = \frac{1}{\mu_0 a} \sum_{k=1}^{\infty} \frac{C_{2k} \cos(\gamma_k z)}{\gamma_k I_0(\gamma_k a) K_1(\gamma_k a)} + \frac{1}{\mu_0 a} \sum_{k=0}^{\infty} \frac{D_{2k+1} \sin(\delta_k z)}{\delta_k I_0(\delta_k a) K_1(\delta_k a)}. \tag{9}$$

The radial component of the magnetic induction field is similarly found to be $$B_r(r, z) = \sum_{k=1}^{\infty} C_{2k} \frac{I_1(\gamma_k r)}{I_0(\gamma_k a)} \sin(\gamma_k z) - \sum_{k=0}^{\infty} D_{2k+1} \frac{I_1(\delta_k r)}{I_0(\delta_k a)} \cos(\delta_k z) \tag{10}$$

inside the coil, where r<a, and $$B_r(r, z) = \tag{11}$$
$$\sum_{k=1}^{\infty} C_{2k} \frac{I_1(\gamma_k a) K_1(\gamma_k r)}{I_0(\gamma_k a) K_1(\gamma_k a)} \sin(\gamma_k z) - \sum_{k=0}^{\infty} D_{2k+1} \frac{I_1(\delta_k a) K_1(\delta_k r)}{I_0(\delta_k a) K_1(\delta_k a)} \cos(\delta_k z)$$

outside the coil, where r>a.

The axial component of the magnetic induction field is found using the same Fourier series methods, and is given by the formulae $$B_z(r, z) = \sum_{k=1}^{\infty} C_{2k} \frac{I_0(\gamma_k r)}{I_0(\gamma_k a)} \cos(\gamma_k z) + \sum_{k=0}^{\infty} D_{2k+1} \frac{I_0(\delta_k r)}{I_0(\delta_k a)} \sin(\delta_k z) \tag{12}$$

inside the coil, where r<a, and $$B_z(r, z) = -\sum_{k=1}^{\infty} C_{2k} \frac{I_1(\gamma_k a) K_0(\gamma_k r)}{I_0(\gamma_k a) K_1(\gamma_k a)} \cos(\gamma_k z) - \tag{13}$$

-continued $$\sum_{k=0}^{\infty} D_{2k+1} \frac{I_1(\delta_k a) K_0(\delta_k r)}{I_0(\delta_k a) K_1(\delta_k a)} \sin(\delta_k z)$$

outside the coil, where r>a. In these formulae, the functions $I_v$ and $K_v$ are modified Bessel functions of the first and second kinds, of order v.

Without intending to limit it in any manner, the present invention will be more fully described by the following examples.

EXAMPLE 1

A. A LINEAR ZONAL FIELD THROUGHOUT THE ENTIRE COIL

As an illustration of the method aspects of the invention, a zonal shim coil that produces a field that varies linearly throughout the entire coil is designed as follows. The target field appropriate to this situation is:

$$B_z(a^-, z) = \mu_0 H_{max} \frac{z}{L}$$

where $H_{max}$ is some characteristic maximum value of the magnetic field (amps/meter).

This field already satisfies condition (5), and from equations (8) the Fourier coefficients are calculated to be $$C_{2k} = 0$$

and $$D_{2k+1} = \frac{2\mu_0 H_{max}(-1)^k}{(\delta_k L)^2}.$$

The current density required on the surface r=a of the coil is now found from equation (9) and the magnetic induction field produced inside and outside the coil is given by equations (10)–(13).

B. THE DESIGN OF GENERAL ASYMMETRIC ZONAL SHIM COILS

The above example dealt with a straightforward linear field. However, the methodology of this invention can also be used for designing coils that produce fields of interest in an asymmetric portion of the coil.

In this case, it will be assumed that the portion of interest within the coil is the region pL<z<qL, which is a subset of the entire coil occupying the space –L<z<L. The fractional numbers p and q therefore satisfy the conditions –1<p<q<1. In the methodology of this invention, the target field $B_z(a^-,z)$ is represented in the general form $$B_z(a^-, z) = \begin{cases} \mu_0 H_{max}(Mz + N), & -L < z < pL \\ \mu_0 H_{max} f(Z_2), & pL < z < qL \\ -\frac{2\mu_0 H_{max}}{(1-q)}\left(\frac{z}{L} - \frac{1+q}{2}\right), & qL < z < L \end{cases} \quad (14)$$

Here, the constant $H_{max}$ is a characteristic magnetic field strength (amps/meter), as before, and the (dimensionless) variable $Z_2$ is defined to be $$Z_2 = \frac{z}{L} - \frac{p+q}{2}. \quad (15)$$

It is only the asymmetric section pL<z<qL that is of interest, so the two linear functions in the other sections of the coil are there merely to make the target field $B_z(a^-,z)$ continuous.

The function $f(Z_2)$ in equation (14) is completely arbitrary, and can be chosen to have any desired shape. Therefore, this invention allows coils to be designed in which the target magnetic field is completely free to be specified by the user, and can be located at any arbitrary asymmetric location within the coil.

To satisfy the continuity of the field at z=qL, it is necessary to choose $f(\beta)=1$, where $$\beta = \frac{q-p}{2}.$$

It is also necessary that the field in equation (14) be continuous at z=pL and that the integral condition (5) must be satisfied. These two requirements determine the two constants M and N in equation (14). They are calculated to be $$M = \frac{2}{(p+1)L} f(-\beta) + \frac{2}{(p+1)^2 L^2} \int_{pL}^{qL} f(Z_2) dz \quad (16)$$

$$N = \frac{(1-p)}{(1+p)} f(-\beta) - \frac{2p}{(p+1)^2 L} \int_{pL}^{qL} f(Z_2) dz,$$

where the variable $Z_2$ has been defined in equation (15).

Equations (14)–(16) provide a general methodology for designing zonal asymmetric magnetic shim coils in which the magnetic field in the section of interest pL<z<qL is entirely at the choice of the user. The Fourier coefficients needed are computed from equation (8), and can be obtained by standard integration. The current density on the coil surface is then given by equation (9), and the magnetic field components are calculated from equations (10)–(13). Once the current density is known, corresponding winding patterns on the coil surface can be produced. These results will now be used to design three asymmetric zonal shim coils of practical interest; these are linear, quadratic and cubic shim coils located asymmetrically. Shim coils that generate higher orders or combinations of orders may be readily designed using these methods.

EXAMPLE 2

A Linear Asymmetric Zonal Field

The general design principles above are here illustrated with respect to a zonal coil in which the target field is linear in the portion of interest pL<z<qL. From equations (14)–(16), the target field is therefore chosen to be $$B_z(a^-, z) = \begin{cases} -\frac{2\mu_0 H_{max}}{(1+p)}\left(\frac{z}{L} - \frac{p-1}{2}\right), & -L < z < pL \\ \frac{2\mu_0 H_{max}}{(q-p)} Z_2, & pL < z < qL, \\ -\frac{2\mu_0 H_{max}}{(1-q)}\left(\frac{z}{L} - \frac{1+q}{2}\right), & qL < z < L \end{cases} \quad (17)$$

where the variable $Z_2$ is as defined in equation (15).

The integrals in equations (8) may now be evaluated using standard techniques to give the Fourier coefficients $$C_{2k} = \frac{2\mu_0 H_{max}}{(\gamma_k L)^2} \left[ -\frac{\{\cos(\gamma_k pL) - \cos(\gamma_k L)\}}{(1+p)} + \right. \quad (18)$$

-continued $$D_{2k+1} = \frac{2\mu_0 H_{\max}}{(\delta_k L)^2}\left[-\frac{\{\sin(\delta_k pL) + \sin(\delta_k L)\}}{(1+p)} + \frac{\{\cos(\gamma_k qL) - \cos(\gamma_k pL)\}}{(q-p)} - \frac{\{\cos(\gamma_k L) - \cos(\gamma_k qL)\}}{(1-q)}\right]$$

$$+ \frac{\{\sin(\delta_k qL) - \sin(\delta_k pL)\}}{(q-p)} - \frac{\{\sin(\delta_k L) - \sin(\delta_k qL)\}}{(1-q)}\right].$$

These coefficients may now be used immediately in equation (9) to give the current density $j_s$ on the surface of the coil, and in equations (10)–(13) to give the magnetic field.

Figure 2A:
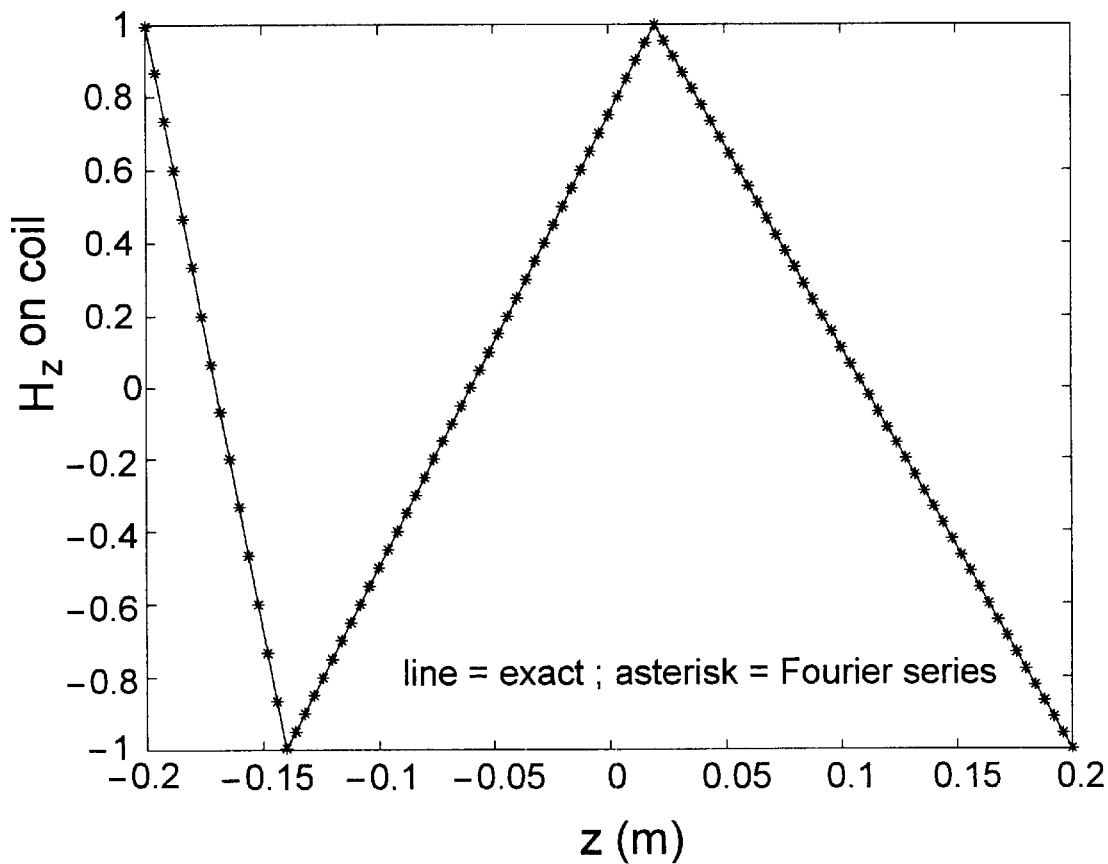
FIG. 2A is a diagram of a target field that is linear in the portion $pL<z<qL$ where $L=0.2$ meters, the total length is 0.4 meters, the diameter of the coil is 0.2 meters, and $p=-0.7$ and $q=0.1$.

The magnetic field on the inside surface of the coil is illustrated in FIG. 2A. In this example calculation, the parameters have been chosen to be p=−0.7 and q=0.1, with a coil radius a=0.1 meters and coil length L=0.2 meters. The characteristic field strength has been chosen to be $H_{max}$=1.0 amps/meter.

The curve sketched as a continuous line in FIG. 2A has been taken directly from the target field in equation (17), and the points drawn with asterisks are values calculated from the Fourier series solution (12), using 301 Fourier coefficients. This figure shows the excellent agreement between the exact target field (17) and the computed result, and confirms the accuracy of the Fourier-series approach of the invention. (Note that the axial component of the magnetic field $H_z = B_z/\mu_0$ has been plotted here, for ease of viewing).

Figure 2B:
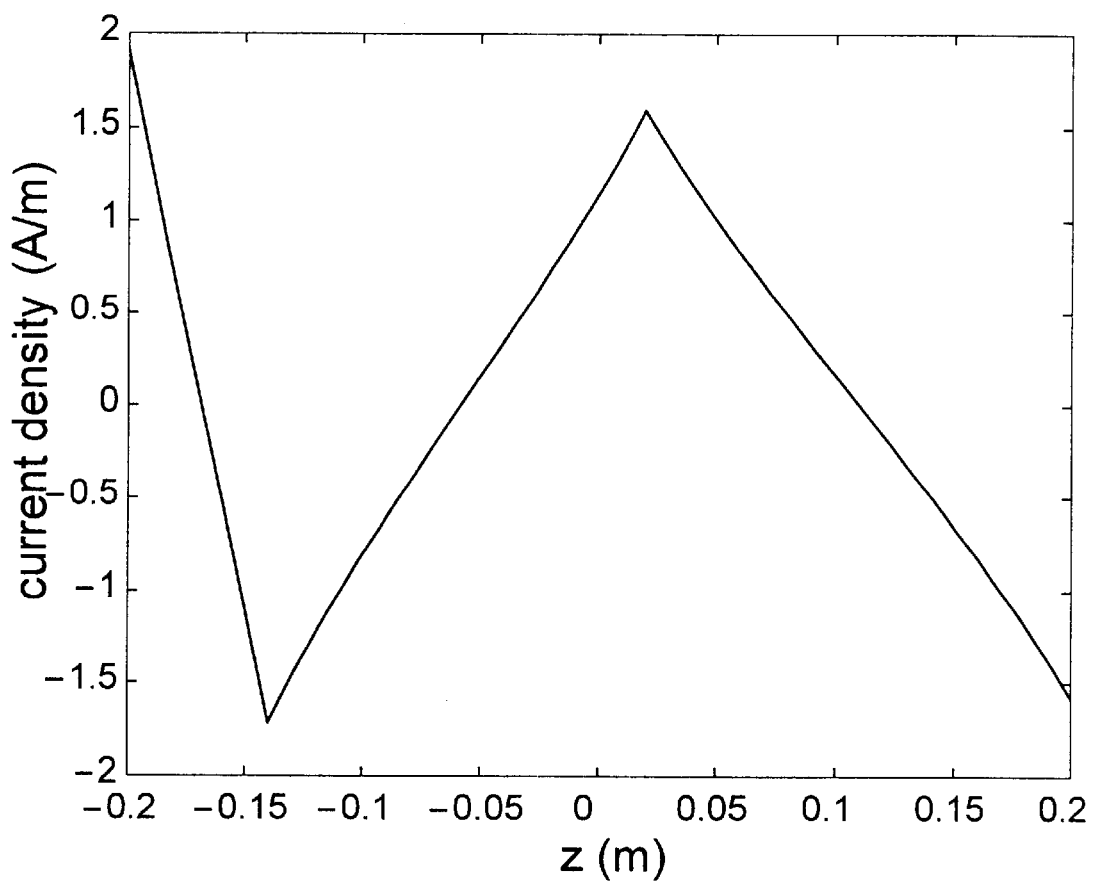
FIG. 2B is the current density required to produce the linear asymmetric field of FIG. 2A.

The current density $j_s$ was calculated from equation (9), using the Fourier coefficients (18) for the asymmetric linear field. The result is shown in FIG. 2B.

In order to generate coil patterns from the current densities, they are first integrated. The number of desired coils is then selected and the integrated current waveform broken into equal elements. A wire is then placed at the centre of each equal current region. The selection of the number of wires required in the coil depends on a number of issues, such as how well the discrete coil structure approximates the continuous current density, and the total impedance of the coil. While the integrated current is increasing the coil winding direction is positive, but a decrease in the integrated current requires a 'negative'—reverse direction, winding. Reverse windings correspond to negative current density regions.

Figure 2C:
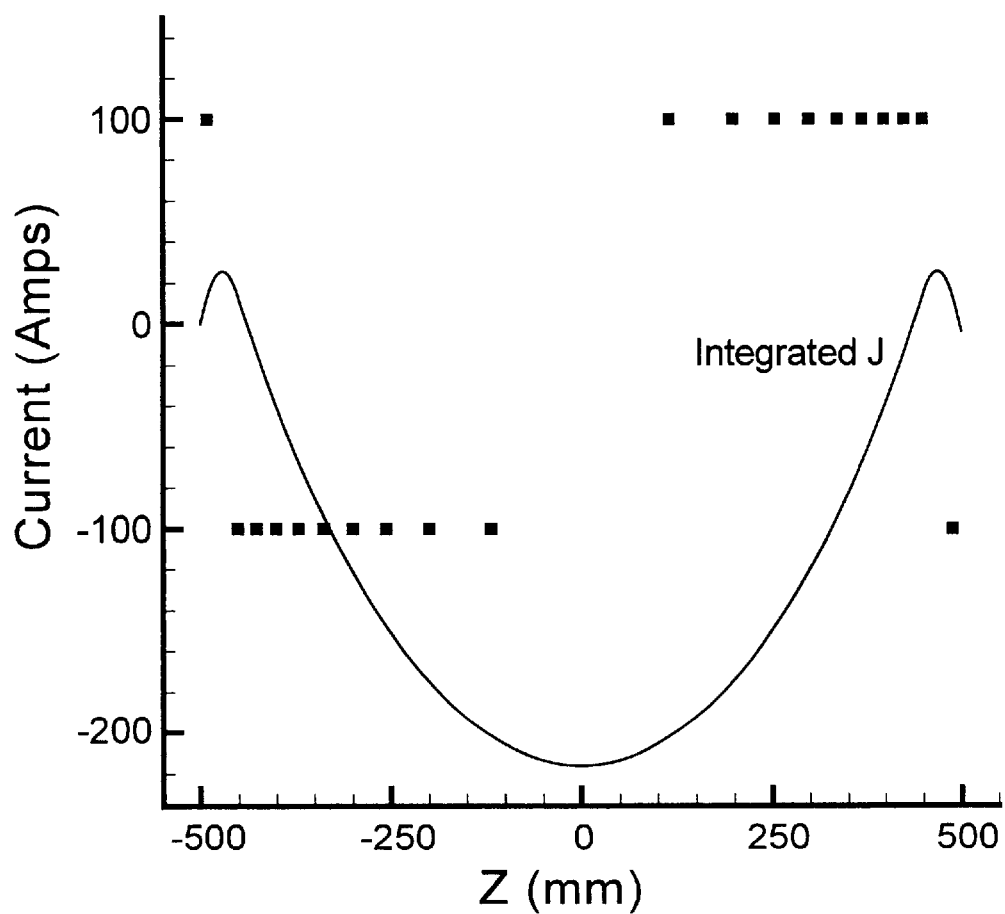
FIG. 2C is the integrated current density and the position of 20 windings or coils (black squares) carrying an arbitrary current of 100 Amps, for the case of a 1 meter coil length, 400 mm diameter, $p=-0.9$, $q=0.9$, and a linear target field. The sign of the current in the coil blocks indicates winding direction.
Figure 2D:
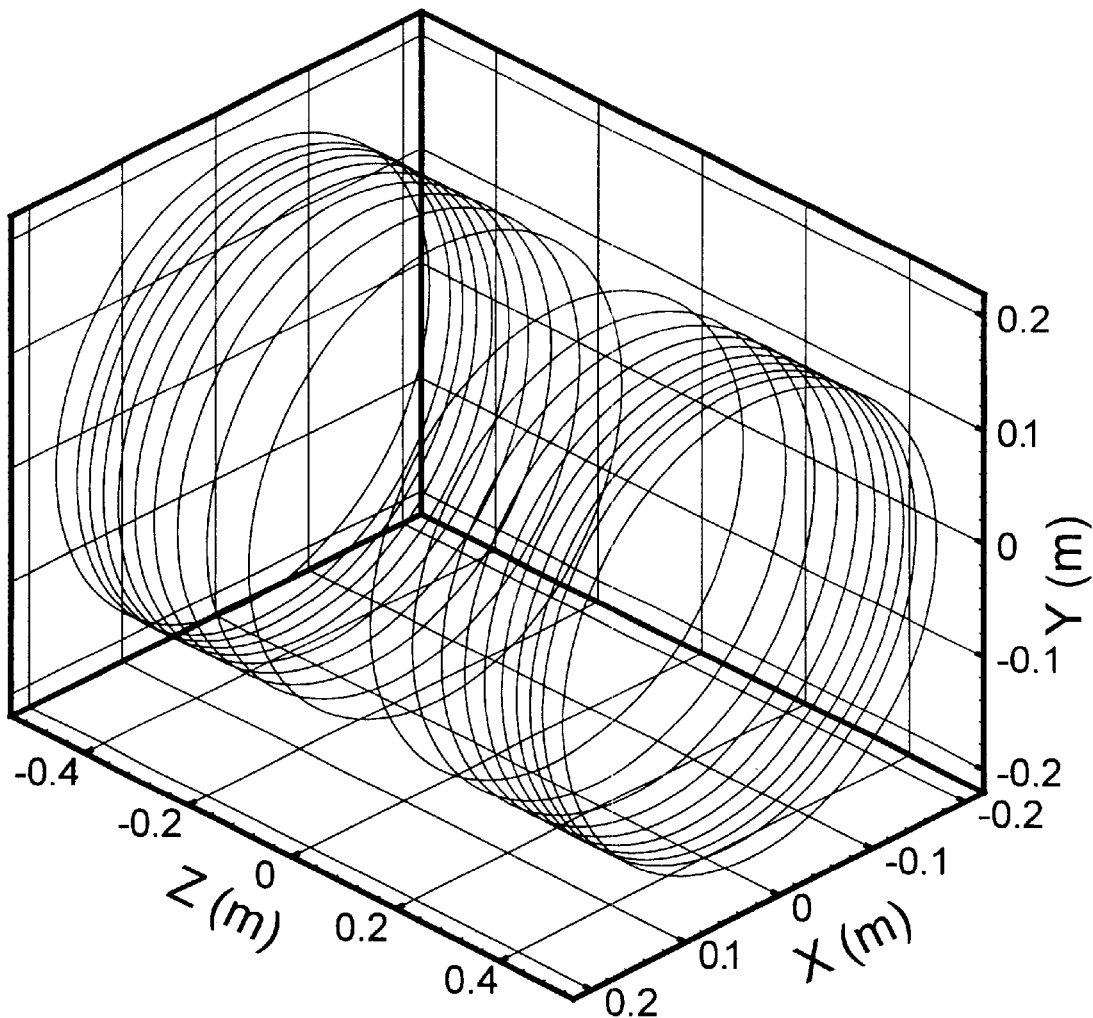
FIG. 2D shows the coil winding pattern associated with the integrated current density of FIG. 2C.

FIG. 2C shows the integrated current and coil positions for a symmetric linear shim system of length 1.0 meter and diameter 0.4 meter. The corresponding winding pattern is given in FIG. 2D. A spherical harmonic deconvolution of the field generated by this coil structure revealed that for up to $6^{th}$ order impurities, the coil generates a first order (linear) harmonic over a sphere of diameter 300 mm with impurity levels of less than 3%, i.e., a P' value of 0.03. This indicates that the coil implementation provides a suitable discretization of the continuous current density.

EXAMPLE 3

A Quadratic Asymmetric Zonal Field

The general design principles described above are here used to design a target field that mimics the second zonal spherical harmonic function $T_2(r,z) \sim 2z^2 - r^2$ at the coil radius r=a, in the asymmetrically located interval pL<z<qL. Spherical harmonics such as this are used to shim impurities in the magnetic field during MRI experiments, so this example serves to illustrate one important practical application of the invention. Using equations (14)–(16), the target field is chosen to be $$B_z(a^-, z) = \begin{cases} \mu_0 H_{\max}\left[1 + \frac{2\kappa}{(1+p)^2}\left(\frac{z}{L} - p\right)\right], & -L < z < pL \\ \frac{\mu_0 H_{\max}}{(2\beta^2 - \alpha^2)}(2Z_2^2 - \alpha^2), & pL < z < qL \\ -\frac{2\mu_0 H_{\max}}{(1-q)}\left(\frac{z}{L} - \frac{1+q}{2}\right), & qL < z < L \end{cases} \quad (19)$$

This field has the required quadratic behaviour in the interval pL<z<qL. For convenience, the constants $$\alpha = \frac{a}{L}, \beta = \frac{q-p}{2} \text{ and } \kappa = \frac{(4/3)\beta^3 + 2(p+1)\beta^2 - (1+q)\alpha^2}{2\beta^2 - \alpha^2} \quad (20)$$

have been defined, and are easily calculated from the parameters governing the coil geometry. The meaning of the variable $Z_2$ has been given previously in equation (15). The Fourier coefficients can now be evaluated from equation (8), and give the result $$C_{2k} = \mu_0 H_{\max}\left[\frac{2\kappa}{(1+p)^2}\frac{\{\cos(\gamma_k pL) - \cos(\gamma_k L)\}}{(\gamma_k L)^2} + \frac{4\beta}{(2\beta^2 - \alpha^2)}\frac{\{\cos(\gamma_k qL) + \cos(\gamma_k pL)\}}{(\gamma_k L)^2} - \frac{4}{(2\beta^2 - \alpha^2)}\frac{\{\sin(\gamma_k qL) - \sin(\gamma_k pL)\}}{(\gamma_k L)^3} - \frac{2}{(1-q)}\frac{\{\cos(\gamma_k L) - \cos(\gamma_k qL)\}}{(\gamma_k L)^2}\right]. \quad (21a)$$

and $$D_{2k+1} = \mu_0 H_{\max}\left[\frac{2\kappa}{(1+p)^2}\frac{\{\sin(\delta_k pL) + \sin(\delta_k L)\}}{(\delta_k L)^2} + \frac{4\beta}{(2\beta^2 - \alpha^2)}\frac{\{\sin(\delta_k qL) + \sin(\delta_k qL)\}}{(\delta_k L)^2} + \frac{4}{(2\beta^2 - \alpha^2)}\frac{\{\cos(\delta_k qL) - \cos(\delta_k pL)\}}{(\delta_k L)^3} - \frac{2}{(1-q)}\frac{\{\sin(\delta_k L) - \sin(\delta_k qL)\}}{(\delta_k L)^2}\right]. \quad (21b)$$

Figure 3A:
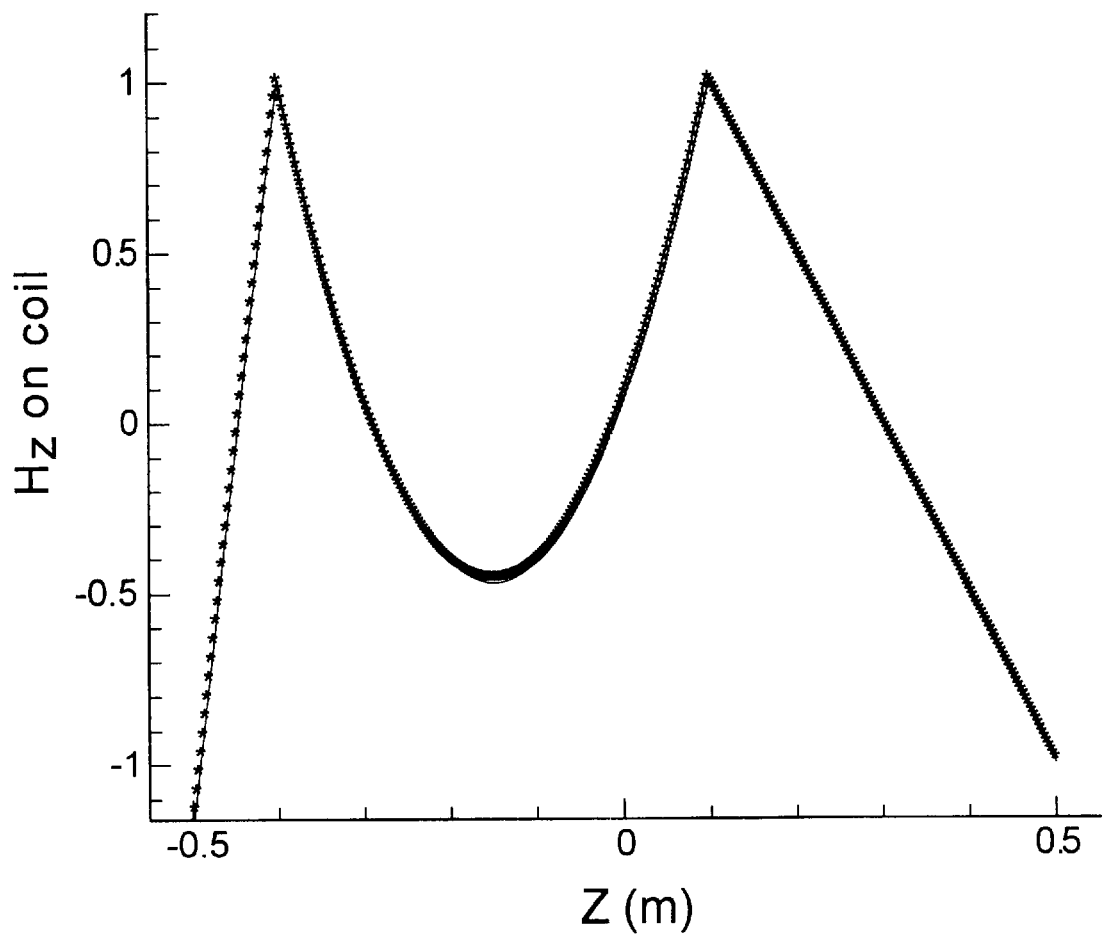
FIG. 3A is a diagram of a target field that is quadratic in the portion $pL<z<qL$ where $L=0.5$ meters, the total length is 1.0 meter, the diameter of the coil is 0.4 meters, and $p=-0.8$ and $q=0.2$.
Figure 3B:
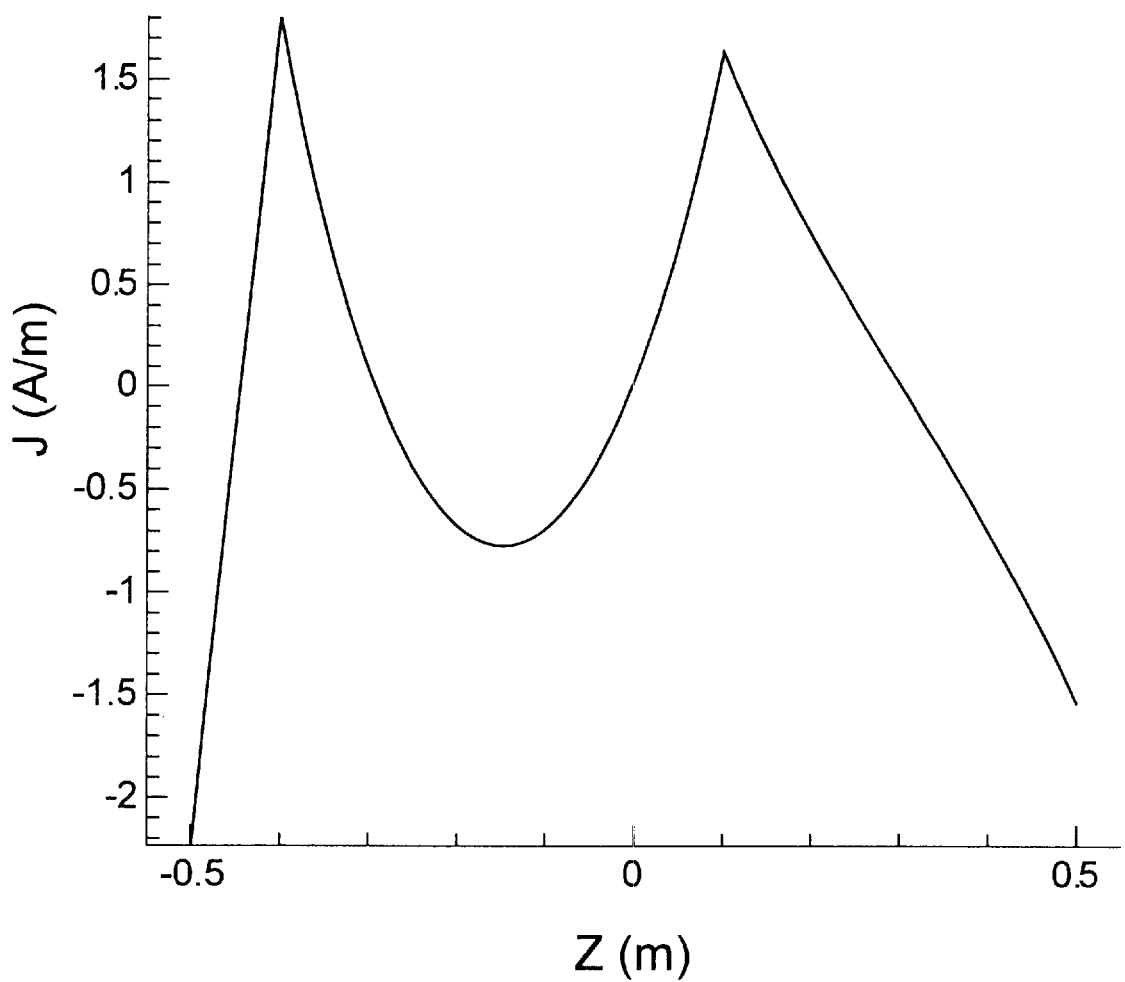
FIG. 3B is the current density required to produce the quadratic field of FIG. 3A.
Figure 3C:
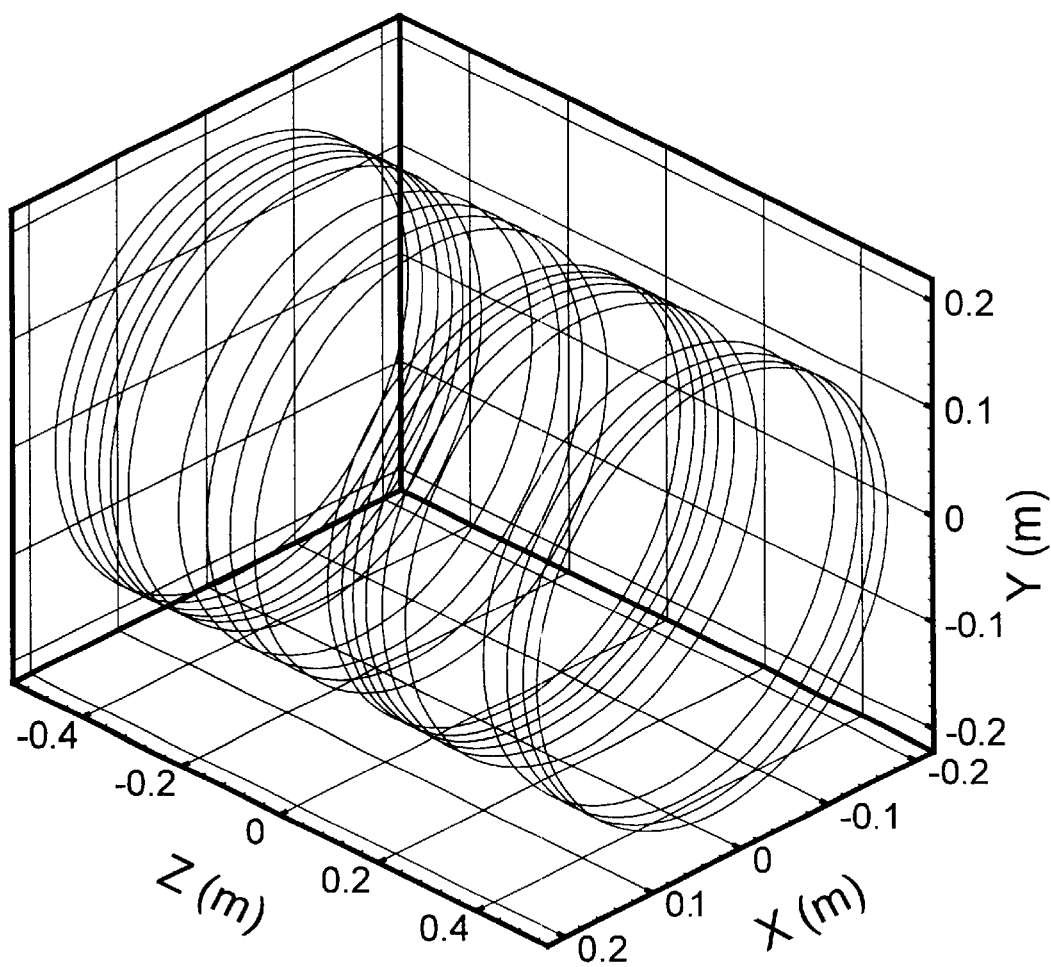
FIG. 3C shows the coil winding pattern associated with a current density where $p=-0.8$, $q=0.2$, length $=1$ meter, diameter $=400$ mm, and a quadratic target field.

The Fourier coefficients in equations (21) have been used to calculate the current density on the coil and the magnetic field. The magnetic field on the inside surface of the coil is sketched in FIG. 3A for a coil of total length 1.0 meter, a diameter of 0.4 meters and p=−0.8, q=0.2. The curve drawn with a continuous line is the exact target field in equation (19), and the points drawn with asterisks are values calculated from the Fourier series solution using 301 Fourier coefficients. Again, the agreement between the exact and calculated values for the target field is excellent, and confirms the accuracy of the Fourier-series approach. The computed current density is shown in FIG. 3B. A winding pattern for the quadratic shim coil is illustrated in FIG. 3C.

EXAMPLE 4

A Cubic Asymmetric Zonal Field

In this example, a target field is designed to mimic the third zonal spherical harmonic function $T_3(r,z) \sim 2z^3 - 3r^2 z$ at the coil radius r=a. This is another case of practical interest in MRI applications. From equations (14)–(16), the target field is chosen to be $$B_z(a^-, z) = \begin{cases} -\dfrac{2\mu_0 H_{\max}}{(1+p)}\left(\dfrac{z}{L} - \dfrac{p-1}{2}\right), & -L < z < pL \\ \dfrac{\mu_0 H_{\max}}{\beta(2\beta^2 - 3\alpha^2)}(2Z_2^3 - 3\alpha^2 Z_2), & pL < z < qL \\ -\dfrac{2\mu_0 H_{\max}}{(1-q)}\left(\dfrac{z}{L} - \dfrac{1+q}{2}\right), & qL < z < L, \end{cases} \quad (22)$$

with $Z_2$ as defined previously in equation (15) and constants $\alpha$ and $\beta$ as in equation (20). In the same manner as the previous two examples, the Fourier coefficients $C_{2k}$ and $D_{2k+1}$ are calculated for this target field (22) using equations (8).

Figure 4A:
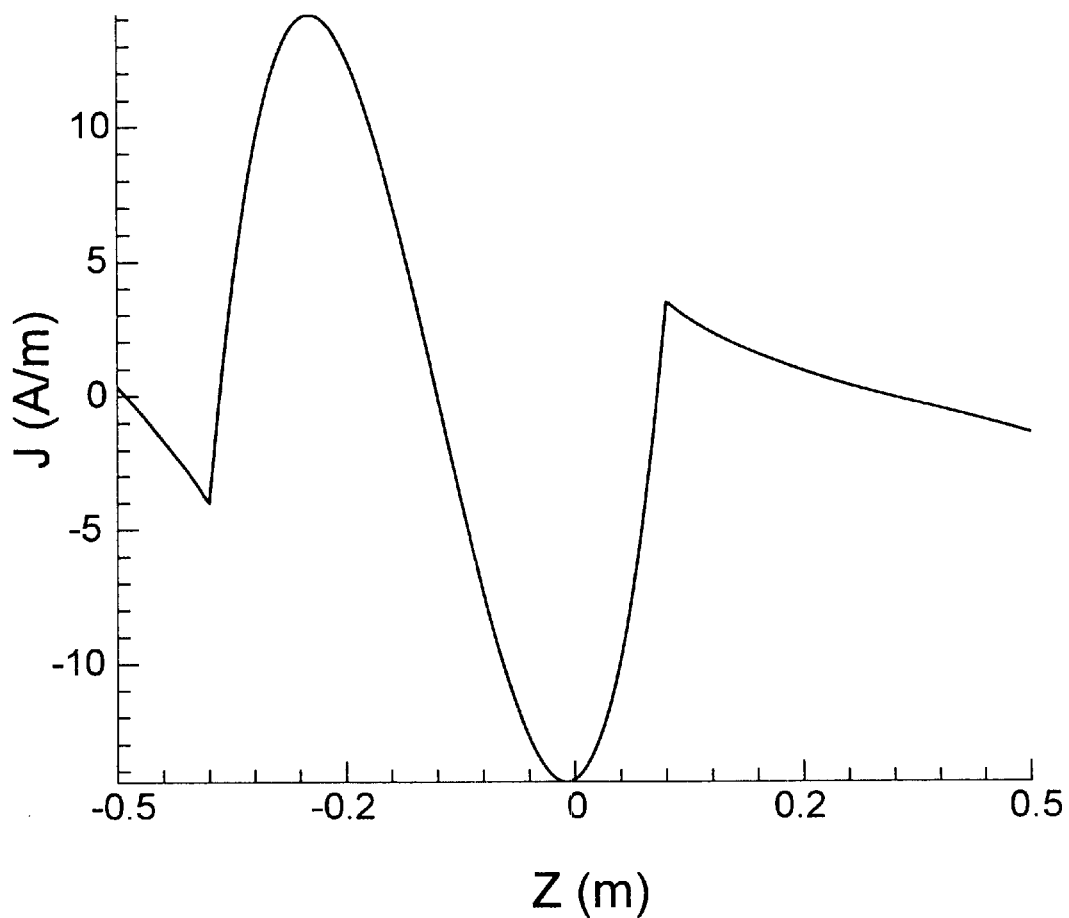
FIG. 4A is a diagram of the current density required to produce a cubic field; that is, a target field that is cubic in the portion $pL<z<qL$ where $L=0.5$ meters, the total length is 1.0 meter, the diameter of the coil is 0.4 meter, and $p=-0.8$ and $q=0.2$.

The current density required to produce the asymmetric cubic zonal field corresponding to equation (22) is shown in FIG. 4A. The parameters were p=−0.8, q=0.2, a=0.2 meters, L=0.5 meters and $H_{max}$=1.0 amps/meter as before, for illustrative purposes.

Figure 4B:
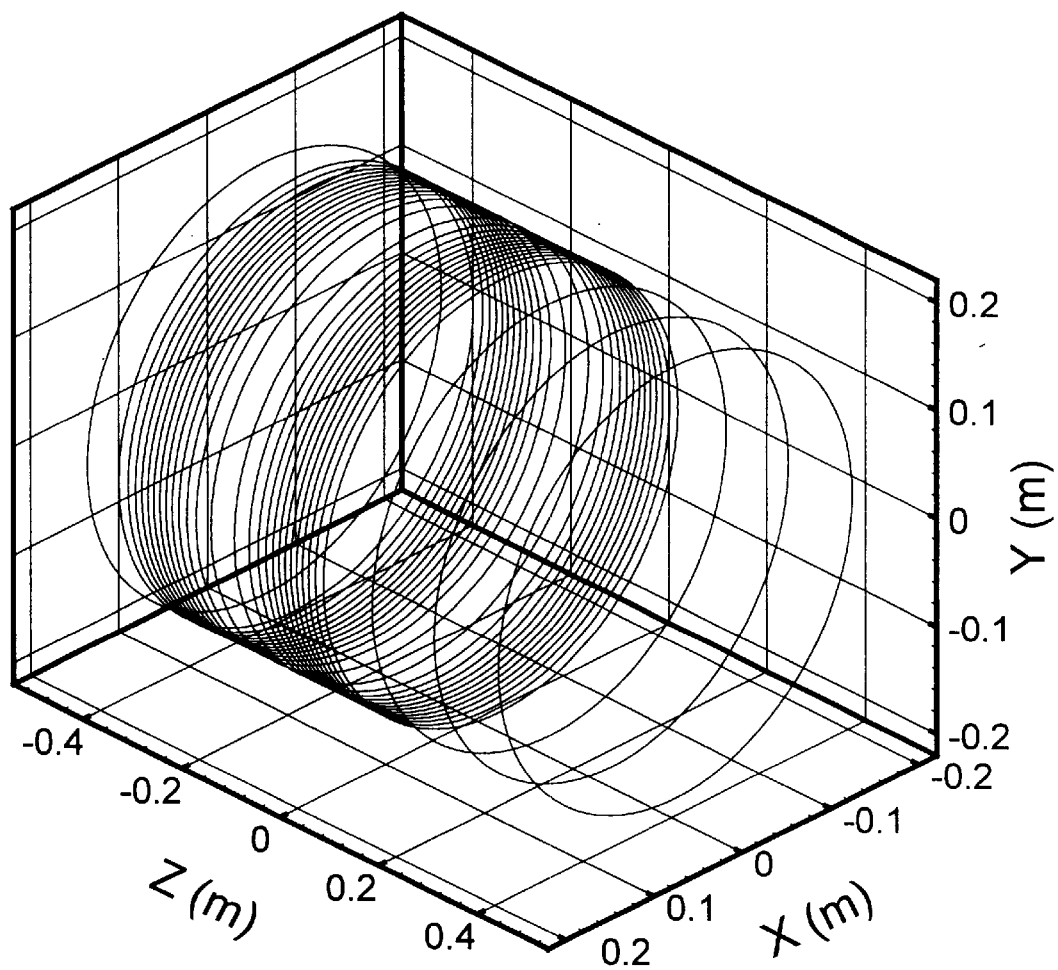
FIG. 4B shows the coil winding pattern associated with the asymmetric current density of FIG. 4A.
Figure 4C:
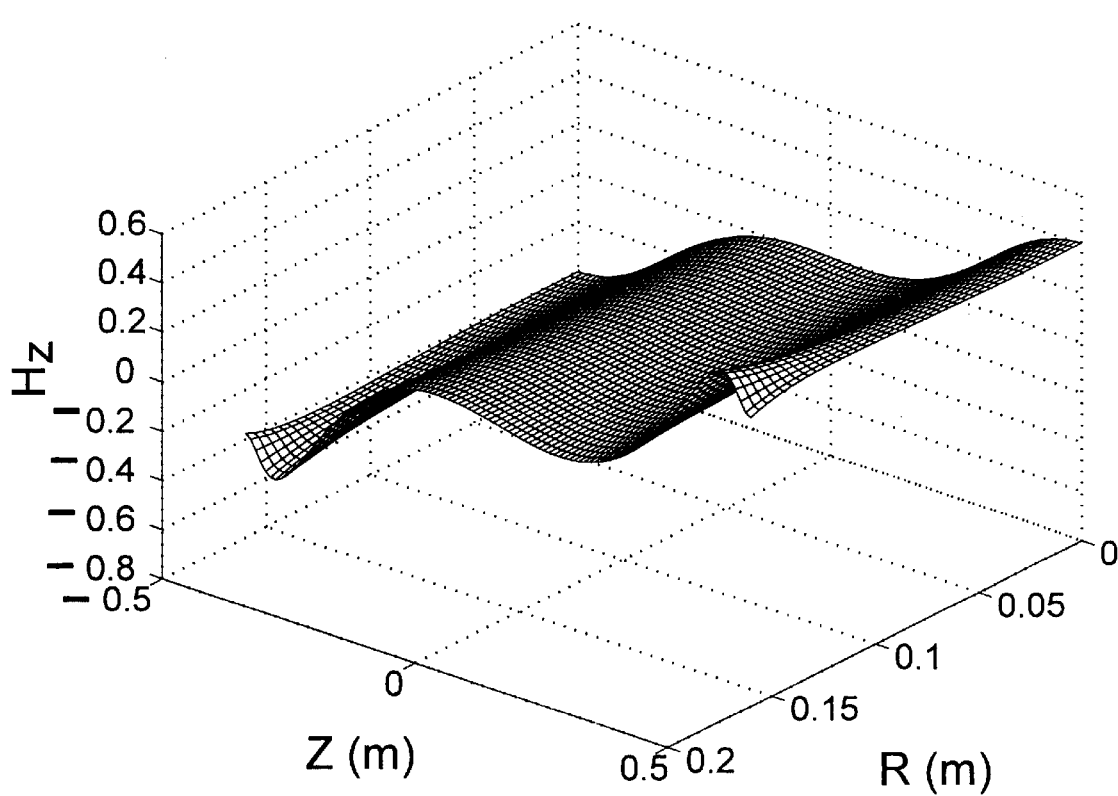
FIG. 4C shows the magnetic field component $H_z$ over the entire coil length and radius, for a symmetric cubic field where $p=-0.95$ and $q=0.95$.

A winding pattern for this cubic coil is given in FIG. 4B. FIG. 4C shows the axial component of the magnetic field for a symmetric cubic coil where p=−0.95 and q=0.95. The cubic variation of the field in the portion of interest pL<z<qL is evident.

The invention has been described with particular reference to asymmetric zonal shim coils and a method for designing such zonal shim coils, in which the section of interest (the DSV) can be placed at an arbitrary location within the coil. However, the method of this invention can be applied to the design of any zonal field of interest, whether designed to produce spherical harmonic components or otherwise, and it has been illustrated here with four examples of practical interest. It will also be understood by those skilled in the art that various changes in form and detail may be made without departing from the spirit and scope of this invention.

What is claimed is:

1. A zonal shim coil having (i) a longitudinal axis and (ii) a predetermined shimming volume, and comprising a plurality of current-carrying windings which surround and are spaced along the longitudinal axis, said coil producing a magnetic field, the longitudinal component of which is given by:

$$B_z(r, \theta) = \sum_{n=0}^{\infty} r^n (a_{n0} P_{n0}(\cos\theta))$$

where $a_{n0}$ are the amplitudes of the zonal harmonics, $P_{n0}(\cos\theta)$ are Legendre polynomials, n is the order of the polynomial, and r and θ are radial and azimuthal coordinates, respectively;

wherein:
  (i) the coil generates a predetermined zonal harmonic whose order (n') is greater than or equal to 2;
  (ii) the coil has first and second ends which define a length 2L; and
  (iii) the predetermined shimming volume extends along the longitudinal axis from z=pL to z=qL, where
    (a) −1<p<q<1;
    (b) |p|≠|q|; and
    (c) z=0 is midway between the first and second ends of the zonal shim coil.

2. The coil of claim 1 wherein:

q−p≧0.01.

3. The coil of claim 1 wherein:

q−p≧0.05.

4. The coil of claim 1 wherein:
  (a) the predetermined shimming volume defines a midpoint M along the longitudinal axis,
  (b) the predetermined shimming volume has a characteristic radius R given by:

R=(q−p)L/2 when q−p<1, and by:

R=(q−p)L/3 when q−p≧1; and (c) the coil has a purity (P') which is less than or equal to 0.2, where:

$$P' = \left(\sum_{0}^{n'-1} |a_{n0}| R^n + \sum_{n'+1}^{n'+6} |a_{n0}| R^n\right) \Big/ (|a_{n'0}| R^{n'}).$$

5. The coil of claim 4 wherein P' is less than or equal to 0.05.

6. The coil of claim 4 wherein:
  (i) n'=2 or 3;
  (ii) q−p≧0.7;
  (iii) 2L≦1.4 meters; and
  (iv) P'≦0.1.

7. The coil of claim 4 wherein:
  (i) n'=4,5,6,7, or 8;
  (ii) q−p≧0.7;
  (iii) 2L≦1.4 meters; and
  (iv) P'≦0.2.

8. The coil of claim 1 wherein |p| or |q| is greater than or equal to 0.7.

9. The coil of claim 1 wherein:
  (i) z<0 at the first end;
  (ii) |p|>|q|; and
  (iii) the number of current-carrying windings for z≦0 is greater than the number of current-carrying windings for z>0.

10. The coil of claim 1 wherein the coil generates at least one additional predetermined zonal harmonic, said at least one additional harmonic having an order different from n'.

11. A magnetic resonance system comprising the zonal shim coil of claim 1.

12. A shim set having (i) a longitudinal axis and (ii) a predetermined shimming volume, said set comprising a plurality of zonal shim coils each of which comprises a plurality of current-carrying windings which surround and are spaced along the longitudinal axis, each of said zonal shim coils producing a magnetic field, the longitudinal component of which is given by:

$$B_z(r, \theta) = \sum_{n=0}^{\infty} r^n (a_{n0} P_{n0}(\cos\theta))$$

where $a_{n0}$ are the amplitudes of the zonal harmonics, $P_{n0}(\cos\theta)$ are Legendre polynomials, n is the order of the polynomial, and r and θ are radial and azimuthal coordinates, respectively;

wherein:
  (i) each of the zonal shim coils generates a predetermined zonal harmonic, said predetermined zonal harmonics differing from one another and at least one of said predetermined zonal harmonics having an order (n') which is greater or equal than 2;

(ii) the zonal shim coils have common first and second ends which define a length 2L; and (iii) the predetermined shimming volume extends along the longitudinal axis from z=pL to z=qL, where
   (a) $-1<p<q<1$;
   (b) $|p| \neq |q|$; and
   (c) z=0 is midway between the common first and second ends.

13. The shim set of claim 12 wherein:

$q-p \geq 0.05$.

14. The shim set of claim 12 wherein:

$q-p \geq 0.5$.

15. The shim set of claim 12 wherein:
(a) the predetermined shimming volume defines a midpoint M along the longitudinal axis,
(b) the predetermined shimming volume has a characteristic radius R given by:

$R=(q-p)L/2$ when $q-p<1$, and by:

$R=(q-p)L/3$ when $q-p \geq 1$; and (c) each of the zonal shim coils has a purity (P') which is less than or equal to 0.2, where:

$$P' = \left(\sum_{0}^{n'-1}|a_{n0}|R^n + \sum_{n'+1}^{n'+6}|a_{n0}|R^n\right) / \left(|a_{n'0}|R^{n'}\right).$$

16. The shim set of claim 14 wherein P' is less than or equal to 0.05 for each of the zonal shim coils.

17. The shim set of claim 15 wherein:
(i) the set comprises three zonal shim coils having n' values of 2, 3, and 4;
(ii) $q-p \geq 0.7$;
(iii) $2L \leq 1.4$ meters; and
(iv) for n' equal to 2 and 3, $P' \leq 0.1$, and for n' equal to 4, $P' \leq 0.2$.

18. The shim set of claim 12 wherein $|p|$ or $|q|$ is greater than or equal to 0.7.

19. The shim set of claim 12 wherein:
(i) z<0 at the first end;
(ii) $|p|>|q|$; and
(iii) the number of current-carrying windings for $z \leq 0$ is greater than the number of current-carrying windings for z>0 for each of the zonal shim coils.

20. A magnetic resonance system comprising the shim set of claim 12.

21. A method for designing a zonal shim coil for a magnetic resonance system, said shim coil extending from $-L$ to $+L$ along a longitudinal axis which lies along the z-axis of a three dimensional coordinate system having a radial coordinate r, said method comprising:

(a) selecting a cylindrical surface having a radius r=a for calculating current densities for the shim coil (the "r=a surface"), said surface surrounding the longitudinal axis, extending from $-L$ to $+3L$, and having a first region which extends from $-L$ to $+L$ and a second region which extends from $+L$ to $+3L$;

(b) for the first region, selecting a set of desired values for the longitudinal component of the magnetic field ($B_z(a^-,z)$) to be produced by the shim coil at locations which are (i) spaced along the longitudinal axis and (ii) on the internal side of the r=a surface ($r=a^-$) wherein:
   (1) the first region consists of first, second, and third subregions which extend in order along the longitudinal axis from $z=-L$ to $z=+L$, with the first subregion extending from $z=-L$ to $z=pL$, the second subregion extending from $z=pL$ to $z=qL$, and the third subregion extending from $z=qL$ to $z=+L$, where:

$-1<p<q<1$;

(2) the desired values for the longitudinal component of the magnetic field are defined by a preselected zonal harmonic for the second subregion;
   (3) the desired values for the magnetic field for the first and third subregions are selected to satisfy the following equation:

$$\int_{-L}^{L} B_z(a^-, z)dz = 0$$

(c) for the second region, selecting a set of calculation values for locations which are (i) spaced along the longitudinal axis and (ii) on the internal side of the r=a surface ($r=a^-$) wherein said set of calculation values are the reflection about z=+L of the set of desired values of the first region; and (d) determining a current density distribution $j_s(z)$ for the shim coil for the first region by:
   (1) calculating coefficients for a Fourier series expansion for the longitudinal magnetic field from the set of selected desired values for the first region and the set of selected calculation values for the second region; and
   (2) calculating the current density distribution by simultaneously solving the following four equations using the Fourier coefficients calculated in step (d) (1):

$B=-\nabla \psi$, $$\nabla^2 \psi = \frac{1}{r}\frac{\partial}{\partial r}\left(r\frac{\partial \psi}{\partial r}\right) + \frac{\partial^2 \psi}{\partial z^2} = 0,$$

$B_r(a^+,z)=B_r(a^-,z)$ on r=a, and $B_z(a^+,z)-B_z(a^-,z)=-\mu_0 j_s(z)$ on r=a where B is the magnetic field, $\psi$ is a magnetic scalar potential, $B_r(a^-,z)$ and $B_r(a^+,z)$ are, respectively, the radial components of the magnetic field on the internal and external sides of the r=a surface, $B_z(a^+,z)$ is the longitudinal component of the magnetic field at the external side of the r=a surface, and $\mu_0$ is the permeability of free space.

22. The method of claim 21 wherein $j_s(z)$ is given by:

$$j_s(z) = \frac{1}{\mu_0 a} \sum_{k=1}^{\infty} \frac{C_{2k} \cos(\gamma_k z)}{\gamma_k I_0(\gamma_k a) K_1(\gamma_k a)} + \frac{1}{\mu_0 a} \sum_{k=0}^{\infty} \frac{D_{2k+1} \sin(\delta_k z)}{\delta_k I_0(\delta_k a) K_1(\delta_k a)}$$

where $$C_{2k} = \frac{1}{L} \int_{-L}^{L} B_z(a^-, z) \cos(\gamma_k z) dz$$

$$D_{2k+1} = \frac{1}{L} \int_{-L}^{L} B_z(a^-, z) \sin(\delta_k z) dz$$

$$\gamma_k = \frac{k\pi}{L}, \text{ and}$$

$$\delta_k = \frac{(2k+1)\pi}{2L}$$

where $I_0$ and $K_1$ are the modified Bessel functions of the first and second kind and of order zero and one, respectively.

23. The method of claim 21 comprising the additional step of generating discrete current carrying windings for the shim coil from the current density distribution $j_s(z)$ by:
   (1) integrating $|j_s(z)|$ with respect to z over the range from −L to +L to determine a total current J;
   (2) selecting a number of current carrying windings N;
   (3) determining a current per winding value I=J/N;
   (4) determining a set of $j_s(z)$ blocks over the range from −L to +L such that the integral of $|j_s(z)|$ over each block equals I; and
   (5) for all blocks having a net polarity for $j_s(z)$ over the block, placing a winding at the center of the block, the direction of the current in the winding corresponding to said net polarity.

24. The method of claim 23 comprising the additional step of producing a shim coil set having at least one shim coil having said discrete current carrying windings.

25. The method of claim 21 wherein $|p|=|q|$.

26. The method of claim 21 wherein $|p|\neq|q|$.

27. The method of claim 21 comprising the additional step of displaying the current density distribution $j_s(z)$ determined in step (d).

28. An article of manufacture comprising a computer usable medium having computer readable code means embodied therein for designing a shim coil in accordance with the method of claim 21.

29. Apparatus for designing a shim coil comprising a programmed computer for performing the method of claim 21.

* * * * *